United States Patent

Carter et al.

[11] Patent Number: 6,110,649
[45] Date of Patent: Aug. 29, 2000

[54] PROCESS FOR MANUFACTURE OF INTEGRATED CIRCUIT DEVICE

[75] Inventors: Kenneth Raymond Carter, San Jose; Craig Jon Hawker, Los Gatos; James Lupton Hedrick, Pleasanton; Robert Dennis Miller, San Jose, all of Calif.; Bernhard Pogge, Hopewell Junction, N.Y.

[73] Assignee: International Business Machines Corporation, Armonk, N.Y.

[21] Appl. No.: 08/974,580

[22] Filed: Nov. 19, 1997

[51] Int. Cl.[7] .......................................................... G03F 7/26
[52] U.S. Cl. ............................................. 430/313; 430/327
[58] Field of Search .................................. 430/313, 315, 430/317, 327, 314

[56] References Cited

U.S. PATENT DOCUMENTS

| | | | |
|---|---|---|---|
| 3,732,181 | 5/1973 | Ray et al. ................................... | 260/41 |
| 4,141,877 | 2/1979 | Luttinger et al. .......................... | 260/37 |
| 4,702,792 | 10/1987 | Chow et al. .............................. | 156/628 |
| 5,043,369 | 8/1991 | Bahn et al. ............................... | 523/466 |
| 5,122,439 | 6/1992 | Miersch et al. ........................... | 430/311 |
| 5,173,392 | 12/1992 | Miersch et al. ........................... | 430/311 |
| 5,252,654 | 10/1993 | David et al. .............................. | 524/414 |
| 5,266,446 | 11/1993 | Chang et al. ............................. | 430/314 |
| 5,275,878 | 1/1994 | Yamakawa et al. ...................... | 428/306 |
| 5,412,160 | 5/1995 | Yasumoto et al. ....................... | 174/258 |
| 5,767,014 | 6/1998 | Hawker et al. ........................... | 438/623 |
| 5,773,197 | 6/1998 | Carter et al. ............................. | 430/313 |
| 5,883,219 | 3/1999 | Carter et al. ............................. | 528/310 |

FOREIGN PATENT DOCUMENTS 512401  11/1992  European Pat. Off. .

OTHER PUBLICATIONS

R. Japp et al., "Low Dielectric Constant Laminates Containing Microspheres", Mat. Res. Soc. Symp. Proc. vol. 372, pp. 221–245, 1995 Materials Research Society.

*Primary Examiner*—Kathleen Duda
*Attorney, Agent, or Firm*—Robert B. Martin

[57] ABSTRACT

The invention relates to a dielectric material and a process for forming an integrated circuit device comprising (i) a substrate; (ii) metallic circuit lines positioned on the substrate and (iii) a dielectric material positioned on the circuit lines. The dielectric material comprises condensed organic polysilica and porous particles.

4 Claims, 2 Drawing Sheets

PROCESS FOR MANUFACTURE OF INTEGRATED CIRCUIT DEVICE

FIELD OF THE INVENTION

The present invention relates to an improved dielectric material for use in an integrated circuit device and a process for manufacturing an integrated circuit device.

BACKGROUND OF THE INVENTION

There is a continuing desire in the microelectronics industry to increase the circuit density and speed in multilevel integrated circuit devices e.g., memory and logic chips, thereby increasing their performance and reducing their cost. In order to accomplish this goal, there is a desire to reduce the minimum feature size on the chip e.g., circuit linewidth, and also to decrease the dielectric constant of the interposed dielectric material to (i) enable higher propagation speed and (ii) enable closer spacing of circuit lines without increase in crosstalk and capacitive coupling. Further, there is a desire to reduce the dielectric constant of the dielectric materials such as utilized in the back end of the line (BEOL) portion of integrated circuit devices, which contain input/output circuitry, to reduce the requisite drive current and power consumption for the device. A dielectric presently used in integrated circuit devices is silicon dioxide which has a dielectric constant of about 4.0. This material has the requisite mechanical and thermal properties to withstand processing operations and thermal cycling associated with semiconductor manufacturing. However, it is desired that dielectric materials for future integrated circuit devices exhibit a lower dielectric constant than exhibited by silicon dioxide. Lui et al., Material Res. Soc. Symp. Proc. 372 (1995) suggested forming a composite dielectric of ceramic and porous microspheres. The powdered ceramic and hollow microspheres were admixed and sintered at a very high temperature (greater than 900° C.) to form the crystallized composite. However, such high temperatures are unsuitable for some manufacturing processes for integrated circuit devices.

It is therefore an object of the present invention to provide a dielectric material and improved process for making an integrated circuit device.

Other objects and advantages will be apparent from the following disclosure.

SUMMARY OF THE INVENTION

The present invention relates to an improved dielectric material comprising condensed organic polysilica and porous particles preferably ceramic particles. The dielectric material is formed by thermal cross condensation of the organic polysilane with the porous particles.

The present invention also relates to a process for forming an integrated circuit device comprising (i) a substrate; (ii) interconnecting metallic circuit lines positioned on the substrate and (iii) the dielectric material of the present invention positioned contiguous to the circuit lines (over and/or between the circuit lines).

A more thorough disclosure of the present invention is presented in the detailed description which follows and from the accompanying drawings.

DETAILED DESCRIPTION OF THE INVENTION

Figure 1:
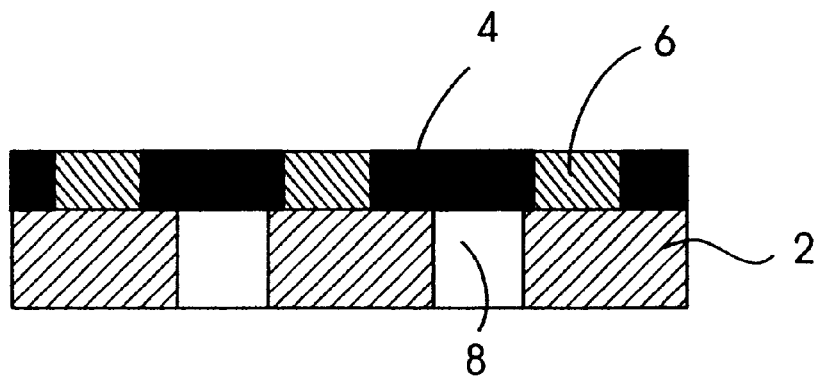
FIG. 1 is a cross-sectional view of a portion of the integrated circuit device formed by the process of the present invention.

An embodiment of the integrated circuit device formed by the process of the present invention is shown in FIG. 1. The device generally comprises substrate 2, metallic circuit lines 4 and dielectric material 6. The substrate 2 has vertical metallic studs 8 formed therein. The interconnected circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the present invention comprises silicon, silicon dioxide, glass, silicon nitride, ceramics, aluminum, copper and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive, material such as copper, aluminum, tungsten, gold, silver, or alloys thereof. Optionally, the circuit lines may be coated with a metallic liner such as a layer of nickel, tantalum or chromium or other layers such barrier or adhesion layers (e.g., SiN, TiN).

The key feature of the present invention is the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises a condensed organic polysilica and porous ceramic particles.

Organic polysilica is a polymeric compound comprising silicon, carbon, oxygen and hydrogen atoms. Suitable organic polysilica include (i) silsesquioxanes (ii) partially condensed alkoxysilanes (e.g., partially condensed by controlled hydrolysis tetraethoxysilane having an Mn of about 500 to 20,000); (iii) organically modified silicates having the composition R $SiO_3$ and $R_2SiO_2$ wherein R is an organic substituent and (iv) partially condensed orthosilicates having the composition $SiOR_4$. Silsesquioxanes are polymeric silicate materials of the type $RSiO_{1.5}$ where R is an organic substituent.

Suitable organic polysilica for use in the present invention are known to those skilled in the art. Preferably, the organic polysilica is a silsesquioxane. Suitable silsesquioxanes for the present invention are alkyl (e.g., $C_{1-6}$, e.g., methyl); aryl (e.g., phenyl) or alkyl/aryl silsesquioxanes which are commercially available (e.g., GR950 from Techniglass, Perrysburg, Ohio). Other suitable silsesquioxanes will be known to those skilled in the art such as disclosed in U.S. Pat. No. 5,384,376, and Chem. Rev. 95, 1409–1430 (1995), the disclosure of which are incorporated herein by reference for all purposes.

A variety of porous particles will be suitable for use in the present invention. Suitable porous particles are generally spherical and may consist of a variety of porous materials including silica, various types of glass and ceramic and various polymers such as polystyrene or polymethyl methacrylate. Suitably, the particles will have surface reactive groups which will enable cross condensation of the particles with the organic polysilica. Preferred particles include ceramic e.g., glass particles having SiOH substituents on their surface to cross condense with the organic polysilica. Suitable particles are microspheres with a diameter of about 5 to 600 nm preferably about 5 to 50 nm. The particles preferably have pore sizes of less than 500 Å, preferably less than 100 Å more preferably less than 20 Å. Further, it is desirable that the pore volume comprise from 5 to 85% of the total volume of the particle. It is preferred that the particles have a coefficient of thermal expansion close to the condensed organic polysilica to enhance the physical properties of the final condensed composite.

The porous dielectric composition of the present invention is formed in a two step process. The first step involves dissolving uncondensed or partially condensed organic polysilica in a suitable high boiling solvent (e.g., N-methyl-2-pyrrolidone, NMP) at room temperature and then uniformly dispersing in the solution a suitable porous particles. Suitably, the mixture will comprise about 20 to 60 weight % of the organic polysilica and the remainder particles. The composition is then applied as a film to a substrate by art known methods such as spin or spray coating or doctor blading.

In the second step of the process of the present invention, the mixture of the organic polysilica and porous particles is heated to an elevated temperature e.g., directly or in a step wise fashion (e.g., 200° C. for 2 hrs. and then ramped up (5° C./min.) to 400° C. and held for 2 hrs.) to cause condensation of the organic polysilica and cross condensation organic polysilica with the reactive groups of the porous particles. The heating in the second step is below 500° C. preferably below 450° C., more preferably below 425° C. A catalyst may be utilized to lower the condensation temperature. Preferably, the composition is heated in the presence of a base such as an amine or Bronsted base. The base catalyzes the condensation reaction enabling a lower initial cure temperature e.g., below 200° C. Suitably, the base is an organic amine. The amine will preferably have a high boiling point and is removable by heating upon completion of the reaction. A suitable base is N-methyldiethanolamine. Other suitable bases will be known to those skilled in the art such as disclosed in U.S. Pat. No. 5,206,117, the disclosure of which is incorporated herein by reference for all purposes. Similarly, the condensation reaction can be catalyzed by Bronsted or Lewis acids.

The dielectric composition of the present invention has a dielectric constant preferably less than 2.8, preferably less than 2.4 and more preferably less than 2.0 at 25° C. The composition preferably comprises about 5 to 30% by volume of pores and has pore sizes preferably less than 1000 Å which result in enhanced mechanical toughness and crack resistance and isotropic optical properties and improved dielectric properties. Further the dielectric composition has mechanical properties that resist cracking and enable it to be chemically/mechanically planarized to facilitate lithographic formation of additional circuit levels in multilevel integrated circuit devices. The dielectric composition has a dielectric strength from 1–5 MV/cm. The dielectric composition is optically clear and adheres well to itself and other substrates. The dielectric composition undergoes minimal shrinkage (e.g., less than 15%) after removal of the solvent during heating.

Figure 2:
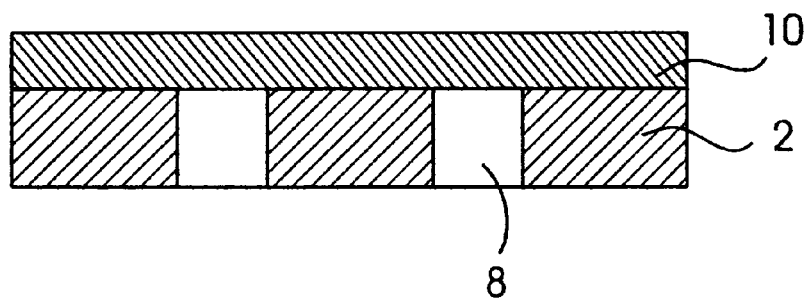
FIGS. 2–5 show a process for making the integrated circuit device of the present invention.

The present invention relates to processes for manufacturing the integrated circuit device. Referring to FIG. 2, the first step of one process embodiment involves disposing on a substrate 2 a layer 10 of the dielectric composition of the present invention comprising organic polysilica and porous particles. The substrate 2 is shown with vertical metallic studs 8. The composition is dissolved in a suitable solvent such as dimethyl propylene urea (DMPU), NMP or the like and is applied to the substrate by art known methods such as spin or spray coating or doctor blading. The second step of the process involves heating the composition to an elevated temperature to cross condense the polysilica silyl reactive groups and the porous particles. Preferably, the composition is heated in the presence of an organic base such as an amine.

Figure 3:
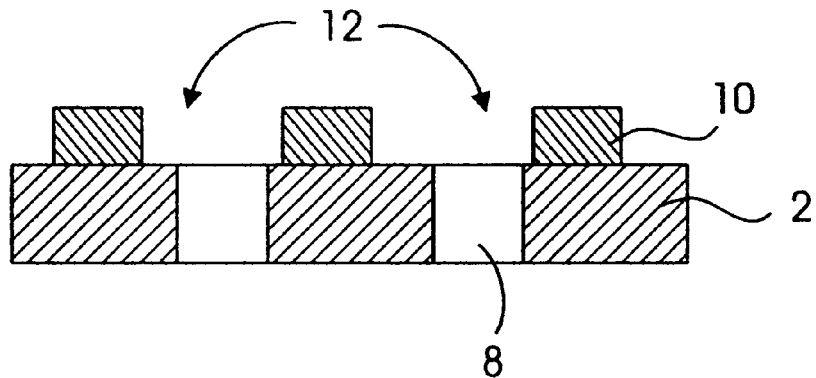

Referring to FIG. 3, the next step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist), (ii) imagewise exposing (through a mask) the photoresist to radiation such as electromagnetic e.g., visible UV or deep UV, (iii) developing the image in the resist e.g., with suitable basic developer and (iv) transferring the image through the layer 10 of dielectric composition to the substrate 2 with a suitable transfer technique such as reactive ion etching. (RIE) Suitable lithographic patterning techniques are well known to those skilled in the art such as disclosed in "Introduction to Microlithography", Thompson et al., (1994), the disclosure which is incorporated herein by reference for all purposes.

Figure 4:
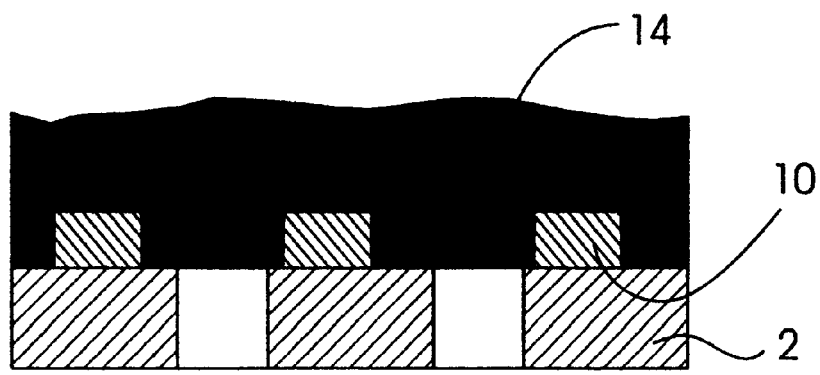

Referring to FIG. 4, in the next step of the process for forming the integrated circuit of the present invention, a metallic film 14 and removing excess metal is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
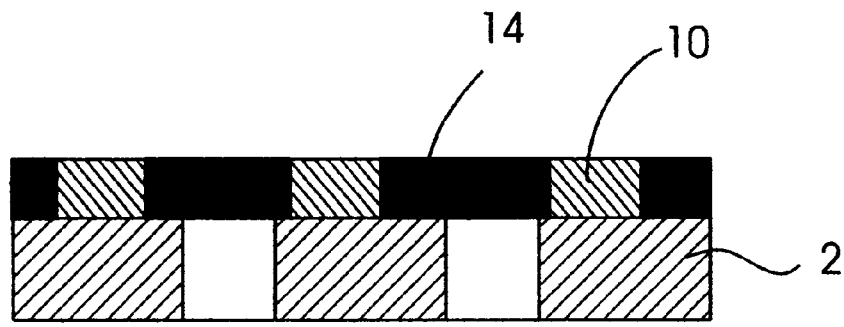

Referring to FIG. 5, the last step of the process involves removal of excess metallic material (e.g., planarizing the metallic film 14) so that the features 14 are generally level with the patterned dielectric layer 10. Planarization can be accomplished using chemical/mechanical polishing or selective wet or dry etching. Suitable chemical/mechanical polishing techniques will be known to those skilled in the art.

Figure 6:
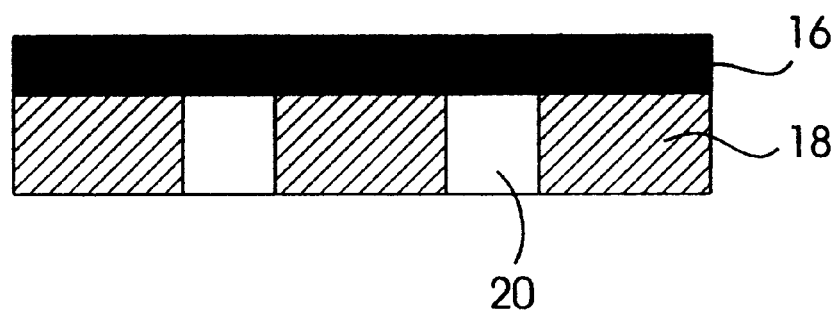
FIGS. 6–8 show an alternative process for making the integrated circuit device of the present invention.
Figure 7:
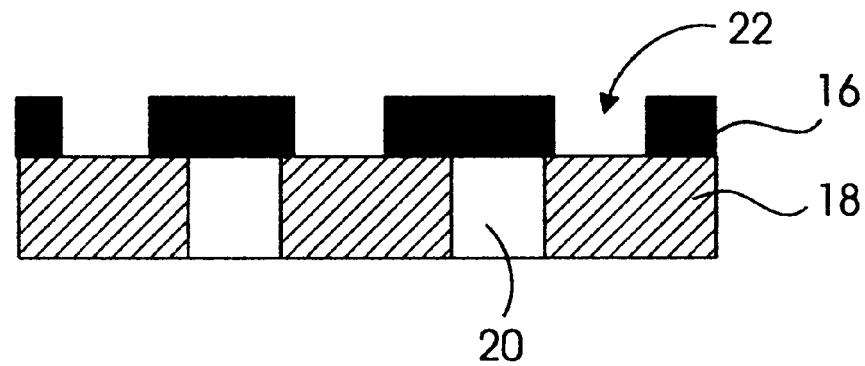
Figure 8:
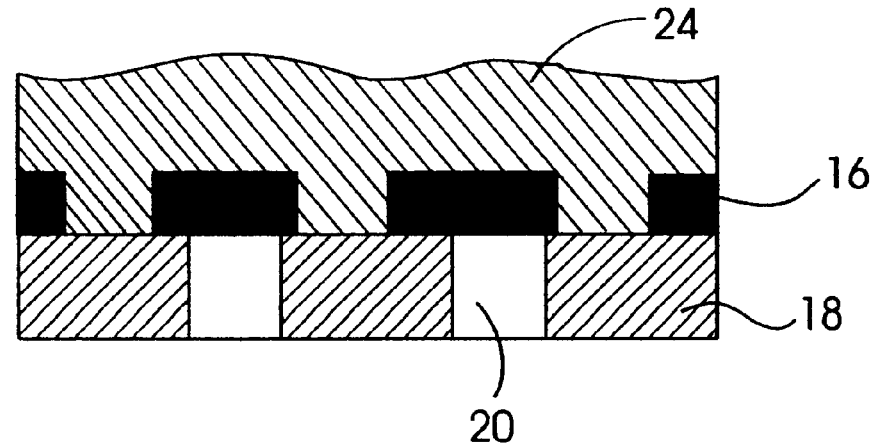

Referring FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the next step of the process, a layer 24 of dielectric composition of the present invention is deposited onto the patterned metallic film 16. In the last step of the process, the composition is heated to condense the organic polysilica and porous particles. Optionally, the dielectric layer may then be planarized for subsequent process in a multilayer integrated circuit.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for forming an integrated circuit comprising:
   (a) positioning, on a substrate, a layer of a dielectric composition comprising porous particles and an organic polysilica, wherein said porous particles include surface reactive groups;
   (b) heating said composition to an elevated temperature of less than 500° C. to condense said organic polysilica and porous particulates;
   (c) lithographically patterning said dielectric layer;
   (d) depositing a metallic film on said patterned dielectric layer; and
   (e) planarizing said film to form an integrated circuit.

2. The process of claim 1 wherein said organic polysilica is silsesquioxane.

3. The process of claim 2 wherein said silsesquioxane is alkyl, phenyl or alkyl/phenyl silsesquioxane.

4. The process of claim 3 wherein said porous particles are porous glass particles.

* * * * *